United States Patent
Lin et al.

(10) Patent No.: US 10,157,258 B2
(45) Date of Patent: Dec. 18, 2018

(54) METHOD FOR EVALUATING FAILURE-IN-TIME

(71) Applicant: Taiwan Semiconductor Manufacturing Co., Ltd., Hsinchu (TW)

(72) Inventors: Chin-Shen Lin, Taipei (TW); Ming-Hsien Lin, Hsinchu County (TW); Kuo-Nan Yang, Hsinchu (TW); Chung-Hsing Wang, Baoshan Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 63 days.

(21) Appl. No.: 15/355,410

(22) Filed: Nov. 18, 2016

(65) Prior Publication Data

US 2018/0144087 A1    May 24, 2018

(51) Int. Cl.
*G06F 17/50*    (2006.01)

(52) U.S. Cl.
CPC ...... *G06F 17/5081* (2013.01); *G06F 17/5077* (2013.01)

(58) Field of Classification Search
CPC ............. G06F 17/5036; G06F 17/5009; G06F 17/5045; G06F 17/5081; G06F 17/5077; G06F 2217/10; G06F 2217/76; G06F 2217/80
See application file for complete search history.

(56) References Cited

U.S. PATENT DOCUMENTS

| | | | |
|---|---|---|---|
| 5,963,831 A * | 10/1999 | Fu | H01L 23/522 257/536 |
| 8,421,205 B2 | 4/2013 | Yang | |
| 8,661,389 B2 | 2/2014 | Chern et al. | |
| 8,698,205 B2 | 4/2014 | Tzeng et al. | |
| 8,826,212 B2 | 9/2014 | Yeh et al. | |
| 8,836,141 B2 | 9/2014 | Chi et al. | |
| 8,875,076 B2 | 10/2014 | Lin et al. | |
| 9,147,029 B2 | 9/2015 | Ke et al. | |
| 9,336,348 B2 | 5/2016 | Hsieh et al. | |
| 9,401,258 B2 | 7/2016 | Hung et al. | |
| 9,412,700 B2 | 8/2016 | Hsieh et al. | |
| 9,431,381 B2 | 8/2016 | Hsieh et al. | |
| 9,477,803 B2 | 10/2016 | Wang et al. | |
| 2009/0132972 A1 * | 5/2009 | Jain | G06F 17/5036 716/136 |
| 2014/0264924 A1 | 9/2014 | Yu et al. | |
| 2014/0282289 A1 | 9/2014 | Hsu et al. | |
| 2015/0279453 A1 | 10/2015 | Fujiwara et al. | |
| 2015/0318241 A1 | 11/2015 | Chang et al. | |
| 2015/0347659 A1 | 12/2015 | Chiang et al. | |
| 2015/0357279 A1 | 12/2015 | Fujiwara et al. | |

(Continued)

*Primary Examiner* — Vuthe Siek
(74) *Attorney, Agent, or Firm* — McClure, Qualey & Rodack, LLP

(57) ABSTRACT

A FIT evaluation method for an IC is provided. The FIT evaluation method includes accessing data representing a layout of the IC comprising a number of metal lines and a number of VIAs; picking a number of nodes along the metal lines; dividing each of the metal lines into a number of metal segments based on the nodes; and determining a FIT value for each of the metal segments or VIAs to verify the layout and fabricate the IC.

20 Claims, 15 Drawing Sheets

(56) References Cited

U.S. PATENT DOCUMENTS

| | | |
|---|---|---|
| 2015/0370946 A1 | 12/2015 | Yang et al. |
| 2016/0012169 A1 | 1/2016 | Chiang et al. |
| 2016/0013271 A1 | 1/2016 | Chiang et al. |
| 2016/0079162 A1 | 3/2016 | Hsieh et al. |
| 2016/0126232 A1 | 5/2016 | Liu et al. |
| 2016/0147927 A1 | 5/2016 | Chiang et al. |
| 2016/0276331 A1 | 9/2016 | Liaw |
| 2017/0147738 A1* | 5/2017 | Saraswat ............ G06F 17/5045 |

* cited by examiner

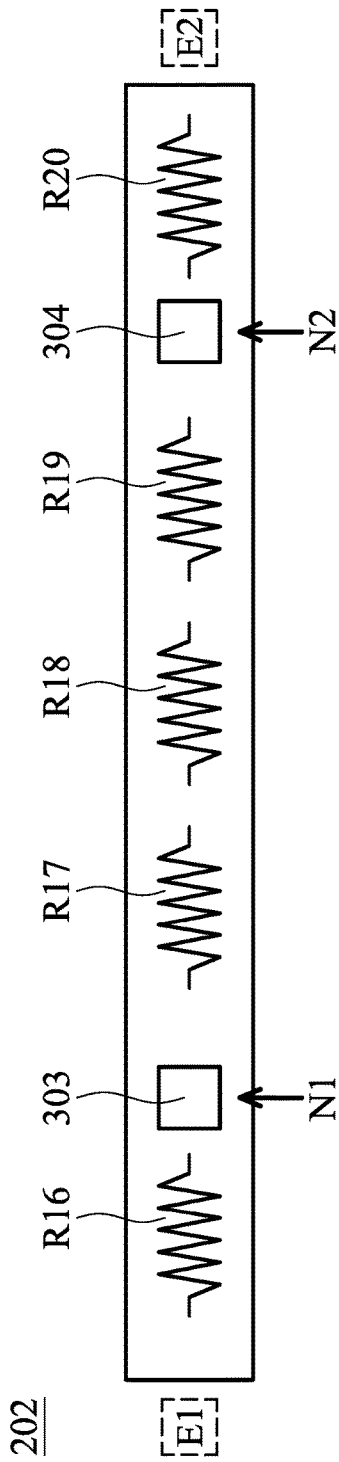
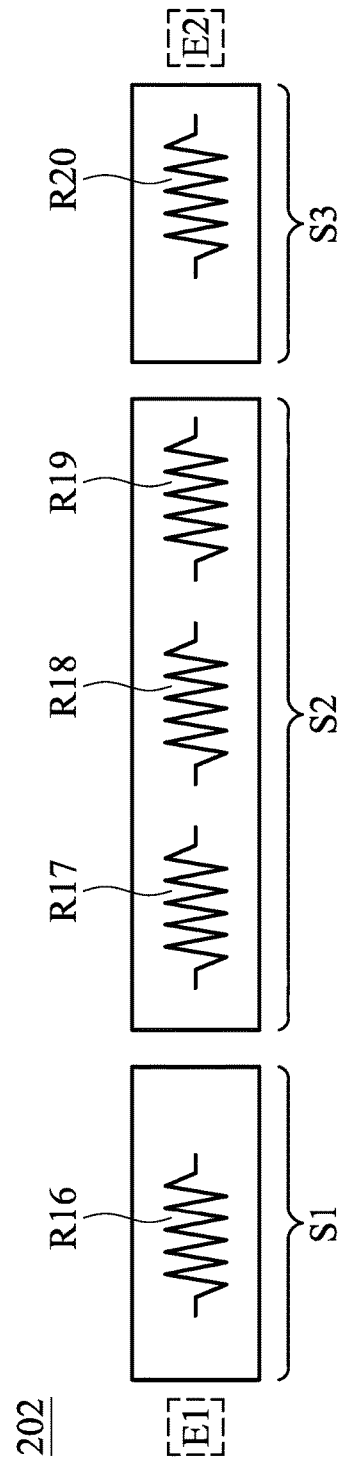
FIG. 3A
FIG. 3B

METHOD FOR EVALUATING FAILURE-IN-TIME

BACKGROUND

Electro-migration (EM) is one of the most important issues in designing integrated circuits (ICs). Specifically, EM is the transportation of material caused by the gradual movement of ions in a conductor due to the momentum transfer between conducting electrons and diffusing metal atoms. The effect appears in applications where high-current pulses are generated, such as in microelectronics and related structures.

The EM effect becomes more apparent as the structure size decreases in electronics such as integrated circuits (ICs). The EM effect is usually evaluated by lifetime and failure rates, and the failure-in-time (FIT) is often utilized to indicate the failure rate of the IC. Therefore, a method for calculating FIT will be needed to evaluate the EM effect on the IC.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 3A-3B are schematic diagrams for illustrating nodes and metal segments of a metal line, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
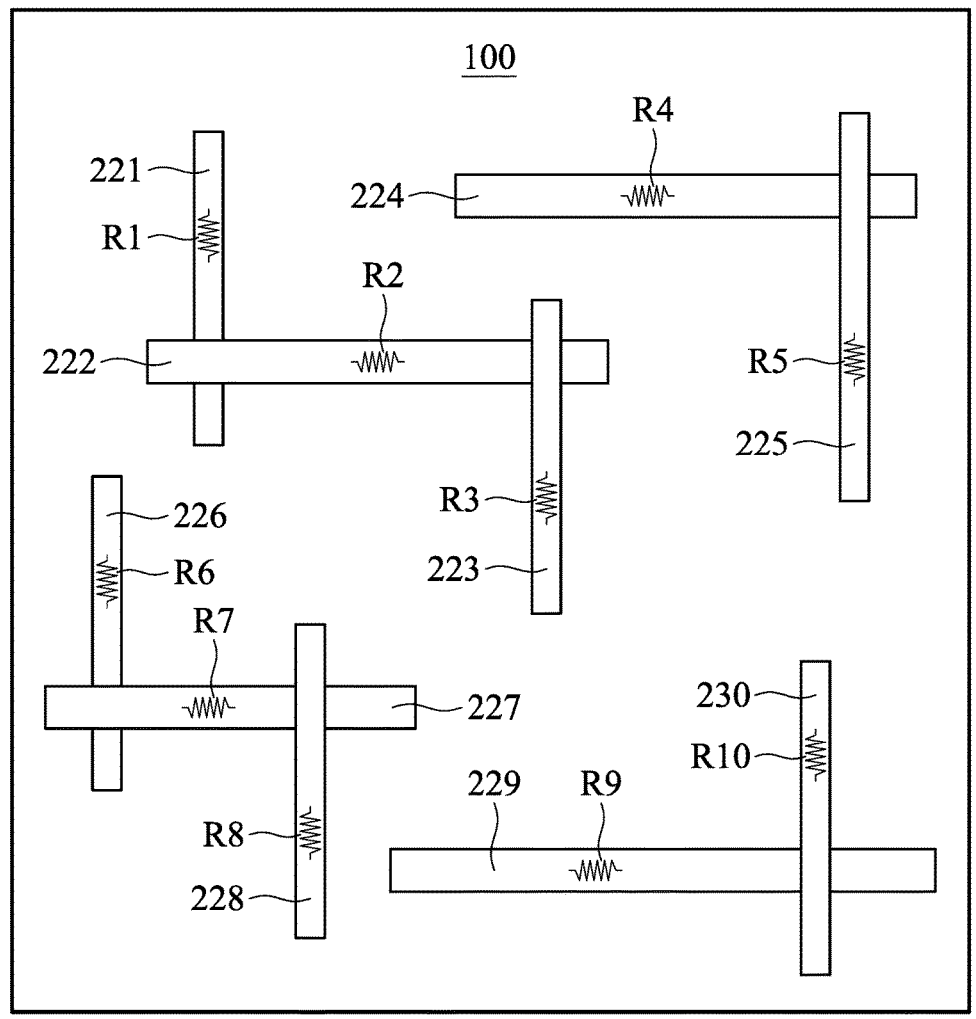
FIG. 1 is a schematic diagram of a chip, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

FIG. 1 is a schematic diagram of a chip 100, in accordance with some embodiments. As shown in FIG. 1, ten metal lines 221-230 are included in the chip 100, and each of resistors R1-R10 is extracted in each of the metal lines 221-230 respectively. The chip 100 can be a portion or a block of an IC.

Specifically, the resistors R1-R10 are extracted from data of design for the IC by Electronic Design Automation (EDA) tools or other circuit simulation tools. Each of the resistors R1-R10 represents an equivalent resistance of a metal line, and the current passing through the metal line can also be estimated by the above simulation tools. In some embodiments, more than one resistor can be extracted in one metal line by EDA tool or other circuit simulation tools.

In order to evaluate the failure rate of the chip 100, failure-in-time (FIT) value can be utilized to estimate the failure rate. Specifically, the failure is resulted from the Electro-migration (EM) effect which might change the resistance value of resistors R1-R10 in the metal lines 210-230. When the resistance value increases above a predetermined percentage, it will be determined to be failed.

The FIT value means the failure per one billion device and hour. In other words, when FIT value is one, it indicates one failure in one thousand products through one million hours, or it may also indicate one failure in 100 thousand products through 10 thousand hours.

More specifically, the FIT value of a metal line or a vertical interconnect accesses (VIA) can be calculated by the following equation:

$$FIT = \frac{(-10)^9}{LT} \times \ln\left(1 - \Phi\left(\frac{\ln(S_{DC}^n \times (LT/MTF))}{\sigma}\right)\right)$$

Regarding the above equation, LT is the lifetime of the product expressed in hours, $\Phi$ is a standard normal cumulative distribution function. $S_{DC}$ is DC EM severity ratio, which is the ratio between DC current of design and DC EM limit from the foundry design rule. MTF is median time to failure in hour, $\sigma$ is spread in lifetime distribution, and n is current density exponent.

In the embodiment of FIG. 1, each FIT value of resistors R1-R10 in the metal lines 221-230 can be calculated using the equation above. It should be noted that resistors R1-R10 are the weak link, which means that resistors R1-R10 are independent and not affected by each other. Therefore, the total FIT value of the chip 100 can be calculated by summing the 10 FIT values of the resistors R1-R10.

Figure 2A:
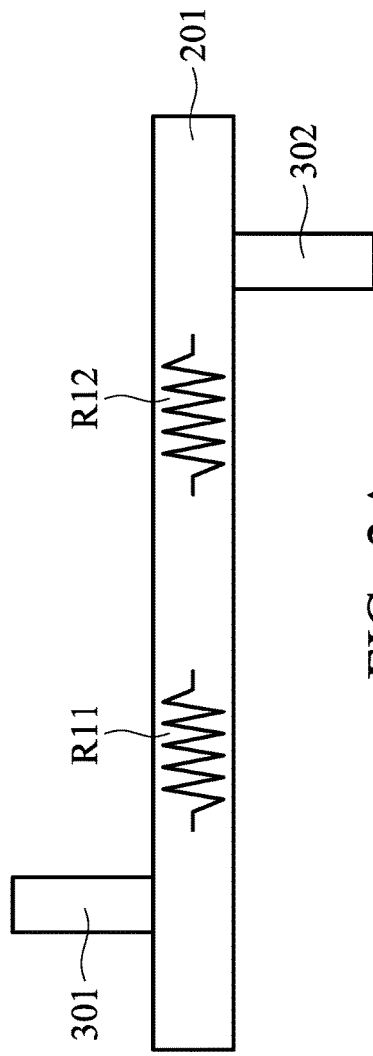
FIGS. 2A-2B are schematic diagrams of resistors of a metal line, in accordance with some embodiments.
Figure 2B:
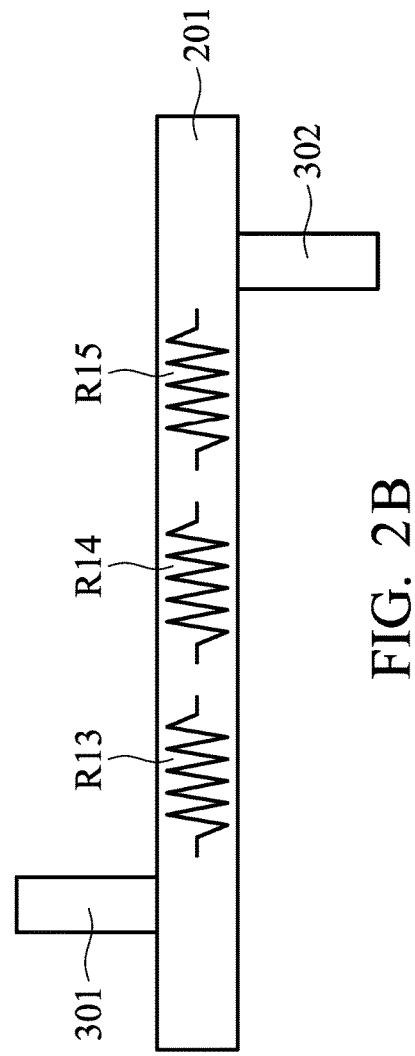

FIGS. 2A-2B are schematic diagrams of resistors of a metal line, in accordance with some embodiments. As shown in FIG. 2A, the metal line 201 is connected with two VIAs 301 and 302. Two resistors R11 and R12 are extracted by circuit simulation tools, and they are arranged along the metal line 201 and between the VIAs 301 and 302. The total FIT value is the summation of FIT values of resistors R11 and R12.

It should be noted that, regarding the same layout and circuit, the extraction of resistors might be different in accordance with the circuit simulation tools. As shown in FIG. 2B, the metal line 201 is connected with two VIAs 301 and 302, which is the same as FIG. 2A. However, three resistors R13, R14 and R15 are extracted by another circuit simulation tool which is different from that of FIG. 2A, and they are arranged along the metal line 201 and between the VIAs 301 and 302. The total FIT value is the summation of FIT values of resistors R13, R14 and R15.

In the embodiments of FIG. 2A and FIG. 2B, although the layout structure and circuit arrangements of metal line 201 and VIAs 301-302 are the same, the total FIT values are different due to the adopted different circuit simulation tools. Even within the same circuit simulation tools, the FIT value will vary corresponding to the criteria of metal line segment.

FIGS. 3A-3B are schematic diagrams for illustrating nodes and metal segments of metal line, in accordance with some embodiments. The metal line 202 has two line ends E1 and E2, and it is connected with two VIAs 303 and 304 which are upward or downward. In the metal line 202, five resistors R16-R20 are extracted by the circuit simulation tools. Resistor R16 is arranged between line end E1 and the VIA 303, resistors R17-R19 are arranged between the VIAs 303 and 304, and resistor R20 is arranged between the VIA 304 and line end E2.

In some embodiments, the VIA 303 is assigned to be the node N1 by EDA tool or other circuit simulation tools, and the VIA 304 is assigned to be the node N2. As such, two nodes N1 and N2 are determined based on the VIAs 303 and 304 along the metal line 202. Afterwards, as shown in FIG. 3B, three metal segments S1-S3 can be determined according to the nodes N1 and N2 by EDA tool or other circuit simulation tools. The metal segments S1, S2 and S3 make up the metal line 202. In other words, the metal line 202 is divided into the three metal segments S1, S2 and S3.

As shown in FIG. 3A and FIG. 3B, the metal segment S1 is arranged between the node N1 and line end E1, the metal segment S2 is arranged between the nodes N1 and N2, and the metal segment S3 is arranged between the node N2 and line end E2. Therefore, the metal segment S2 is defined by two adjacent and different nodes N1 and N2.

Regarding the metal segment S1, FIT value can be evaluated for the resistor R16 in metal line 202. Regarding the metal segment S3, FIT value can be evaluated for the resistor R20 in metal line 202.

Since three resistors R17-R19 are included by the metal segment S2, three FIT values corresponding to the resistors R17-R19 of the metal segment S2 can be calculated respectively. In some embodiments, the maximum FIT value is determined to be a representative FIT value of the metal segment S2. In other words, the highest FIT value will be the representative FIT value of the metal segment S2.

For example, when the FIT value of the resistor R19 is greater than the other two FIT values of resistors R17 and R18, the FIT value of resistor R19 will be determined to be the representative FIT value for the metal segment S2.

Regarding the metal segment having more than two resistors, the maximum FIT value is determined to be the representative FIT value of the metal segment, and other small FIT values will not contribute to the representative FIT value. In the embodiments of FIGS. 2A-2B, all FIT values of the multiple resistors in the metal lines are added to derive the representative FIT value of a segment of metal line.

Compared to the representative FIT value of embodiments of FIGS. 2A-2B, the representative value of the metal segment S2 of FIG. 3B will become smaller. Therefore, the FIT value of the metal segment can be reduced. The process of evaluating the FIT value for the IC becomes efficient and convenient, regardless of the circuit simulation tools used.

Afterwards, the total FIT value of the IC can be obtained by summing the FIT value and/or the representative FIT value of each of the metal segments S1-S3. Regarding the metal segment S2, when the FIT value of the resistor R19 is greater than the other two FIT values of resistors R17 and R18, the total FIT value can be obtained by adding the three FIT values of resistors R16, R19 and R20 of the metal line 202.

The FIT value and/or the representative FIT value of each of the metal segments are added to derive the total FIT value of the IC. The total FIT value can be utilized to verify the layout and fabricate the IC. Specifically, when the total FIT value meets the requirement of IC design, it means that the layout is certified and the IC can be manufactured based on the certified layout.

When the total FIT value meets the requirement of IC design, some semiconductor processes are performed on a wafer to manufacture at least one IC corresponding to the certified layout. When the total FIT value does not meet the requirement of IC design, it means the layout is not certified, and the data for designing the IC needs to be revised and modified.

For example, when the total FIT value is smaller than a threshold value, the EDA tool or circuit simulation tools determine that it meets the requirement of IC design. When the total FIT value is greater than a threshold value, the EDA tool or circuit simulation tools determine that it does not meet the requirement of IC design.

Figure 4A:
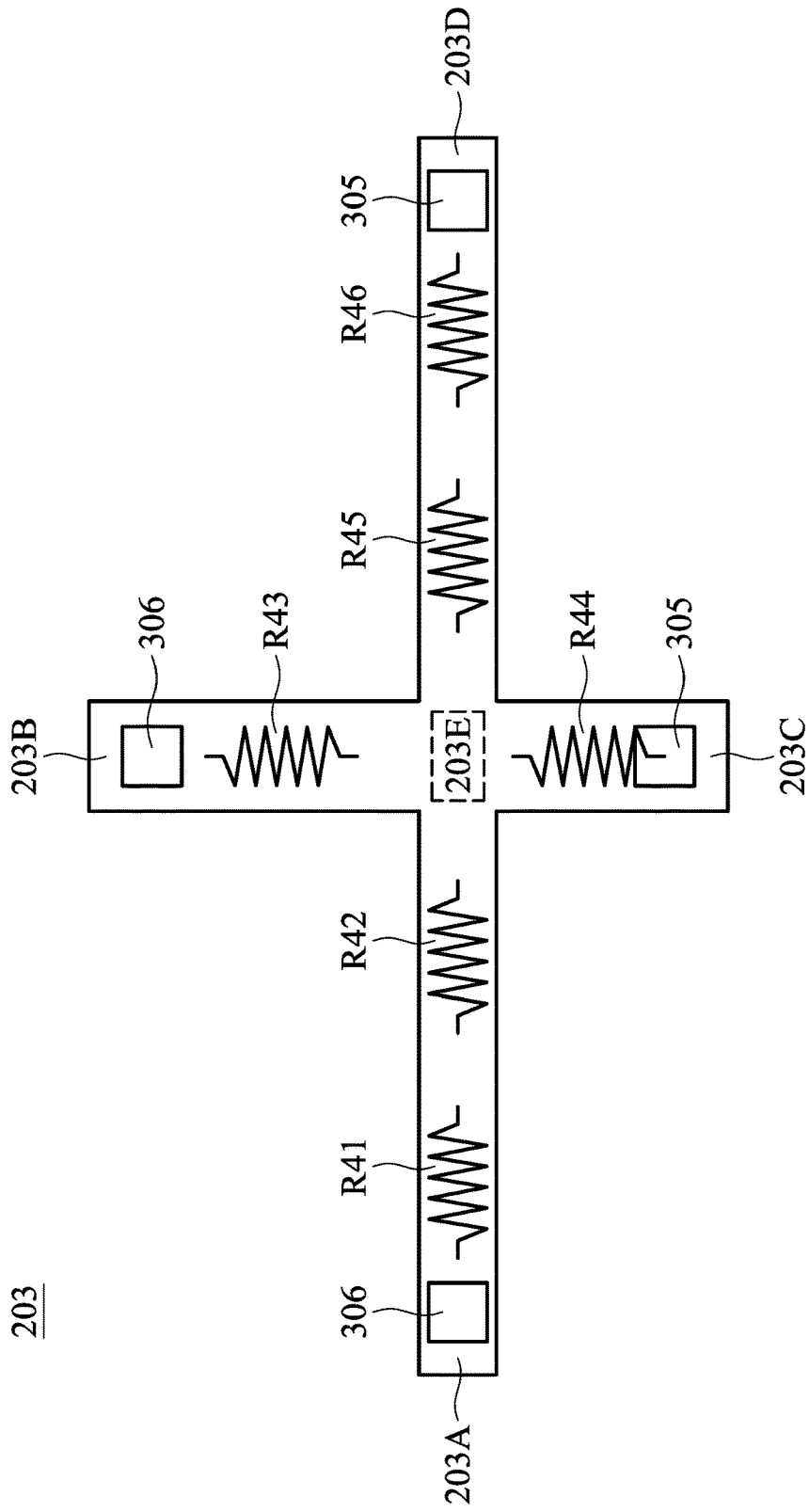
FIGS. 4A-4B are schematic diagrams for illustrating nodes and metal segments of metal lines, in accordance with some embodiments.
Figure 4B:
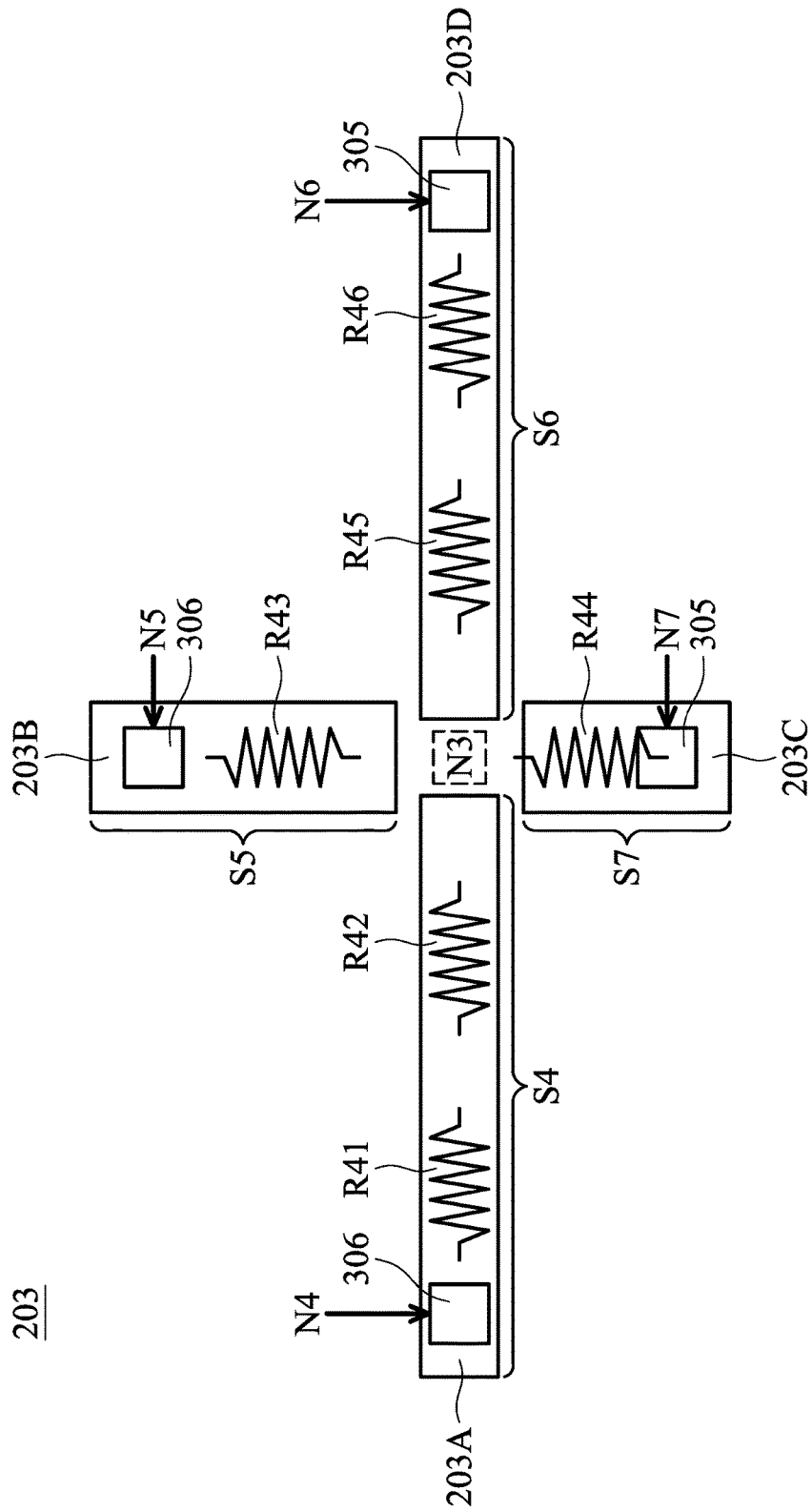

FIGS. 4A-4B are schematic diagrams for illustrating nodes and metal segments of a metal line, in accordance with some embodiments. As shown in FIG. 4A, the metal line 203 is connected with VIAs 305 and 306. The shape of metal line 203 is a cross-junction. Furthermore, the metal line 203 includes four branches 203A-203D and an intersection 203E. Branches 203A and 203D are perpendicular to the branches 203B and 203C, and each of the four branches 203A-203D are connected to the intersection 203E.

In some embodiments, as shown in FIG. 4B, the intersection 203E of the metal line 203 is assigned to be the node N3. The VIAs 306 are determined to be nodes N4 and N5, and VIAs 305 are determined to be nodes N6 and N7. The metal segments S4-S7 can be determined and divided based on the nodes N3-N7 by the EDA tool or circuit simulation tools. The metal segment S4 is arranged between nodes N3 and N4, metal segment S5 is arranged between nodes N3 and N5, metal segment S6 is arranged between nodes N3 and N6, and metal segment S7 is arranged between nodes N3 and N7.

The metal segment S4 includes resistors R41 and R42, metal segment S5 includes resistor R43, metal segment S6 includes resistors R45 and R46, metal segment S7 includes resistor R44. The FIT values of each of the metal segments S4-S7 can be calculated accordingly. The representative FIT values of the metal segments S4-S7 can be determined by the maximum FIT value in each metal segment. Details relating to the calculation of the FIT value have been illustrated before, and in the interests of brevity they will not be repeated herein.

Figure 5A:
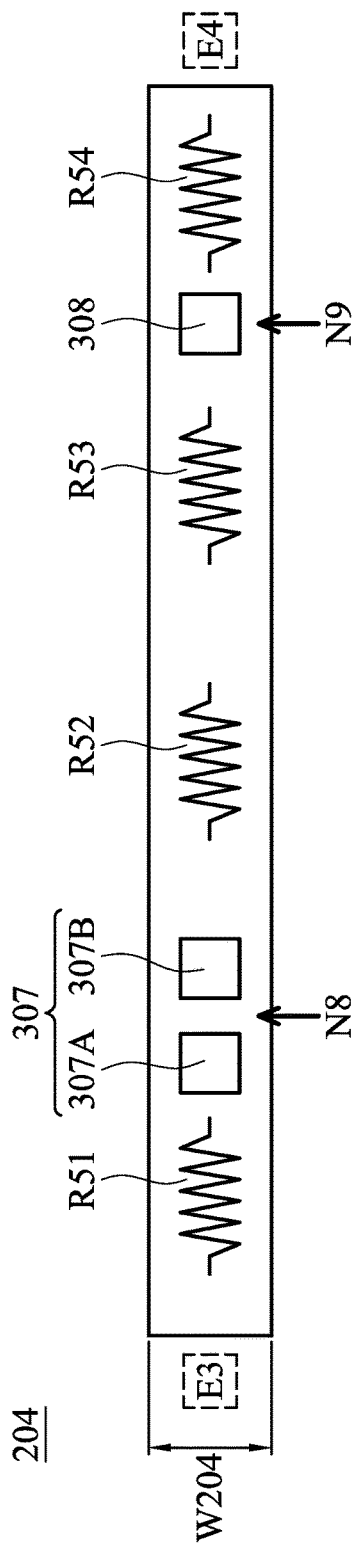
FIGS. 5A-5B are schematic diagrams for illustrating nodes and metal segments of a metal line, in accordance with some embodiments.
Figure 5B:
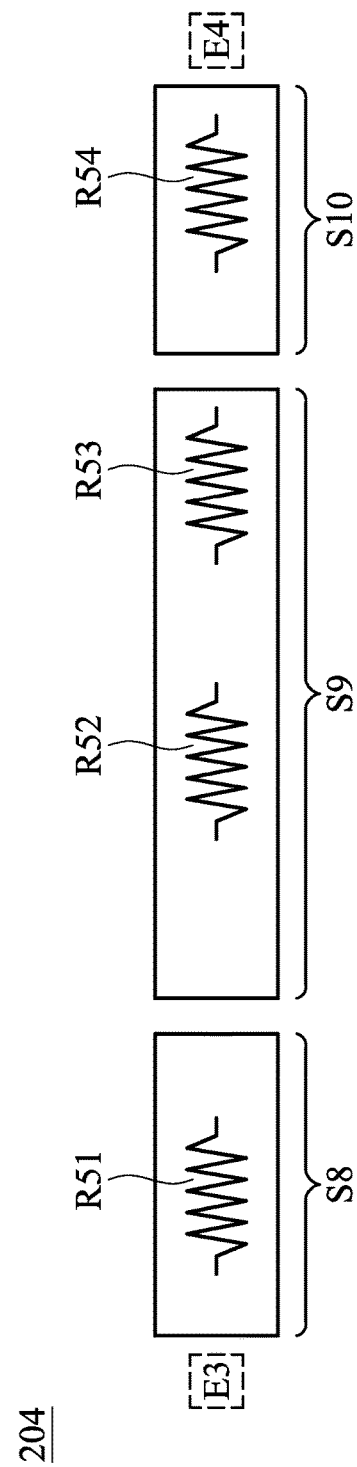

FIGS. 5A-5B are schematic diagrams for illustrating nodes and metal segments of a metal line, in accordance with some embodiments. The metal line 204 is connected with VIA array 307 and VIA 308. In the metal line 204, four resistors R51-R54 are extracted by EDA tool or circuit simulation tools.

As shown in FIG. 5A, the VIA array 307 includes a number of VIAs 307A and 307B. The VIAs 307A and 307B are close to each other to form the VIA array 307. More specifically, the distance between the VIAs 307A and 307B is smaller than line width S204 of the metal line 204. In addition, there is no resistor extracted by the circuit simulation tools between the two VIAs 307A and 307B.

In some embodiments, the VIA array 307 is determined to be node N8, and VIA 308 is node N9. As shown in FIG. 5A and FIG. 5B, metal segment S8 is determined between line end E3 and N8, metal segment S9 is determined between nodes N8 and N9, and metal segment S10 is determined between node N9 and line end E4. Afterwards, the FIT values of each of the metal segments S8-S10 can be calculated accordingly. Details of the calculation of the FIT value have been illustrated before, and will not be repeated.

Figure 6A:
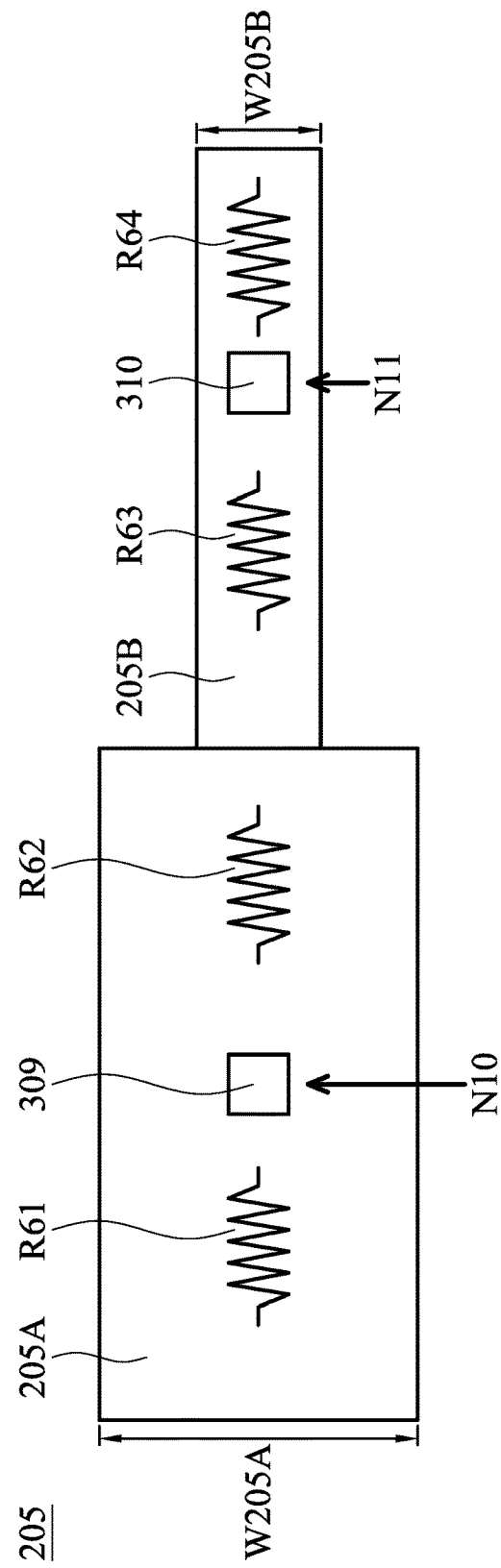
FIGS. 6A-6B are schematic diagrams for illustrating nodes and metal segments of a metal line, in accordance with some embodiments.
Figure 6B:
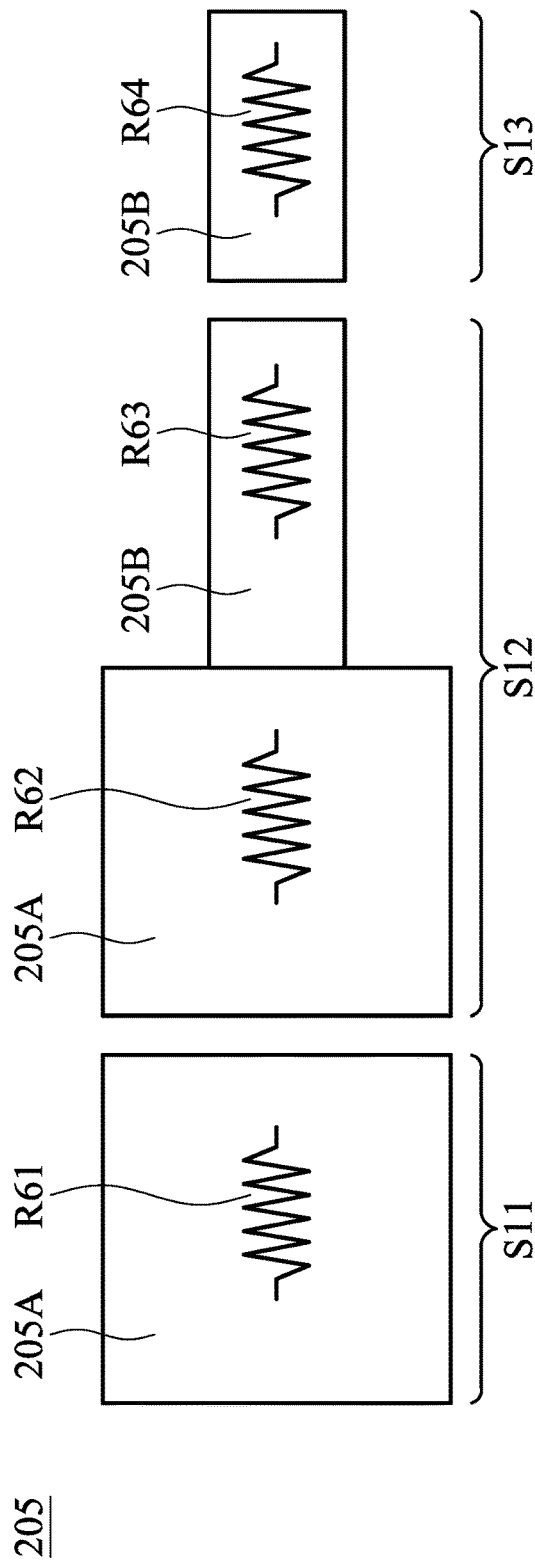

FIGS. 6A-6B are schematic diagrams for illustrating nodes and metal segments of metal lines, in accordance with some embodiments. As shown in FIG. 6A, the metal line 205 can be divided into metal line 205A with line width W205A and metal line 205B with line width W205B. Line width W205A is greater than line width W205B. VIA 309 is connected to the metal line 205A, and the VIA 310 is connected to the metal line 205B.

As illustrated before, the VIAs 309 and 310 are assigned to be the nodes N10 and N11 respectively. Accordingly, three metal segments S11-S13 can be determined based on the nodes N10 and N11. Metal Segment S11 includes resistor R61, metal segment S12 includes resistors R62 and R63, and metal segment S13 includes resistor R64.

It should be noted that a portion of metal line 205A (including resistor R62) and a portion of metal line 205B (including resistor R63) form the metal segment S12. In other words, the metal segment S12 includes a number of metal lines whose line widths are different. The FIT values of each of the metal segments S11-S13 can be calculated accordingly. The representative FIT values of the metal segments S11-S13 can be determined by the maximum FIT value in each metal segment. Details relating to the calculation of the FIT value have been illustrated before, and in the interests of brevity they will not be repeated herein.

Figure 7:
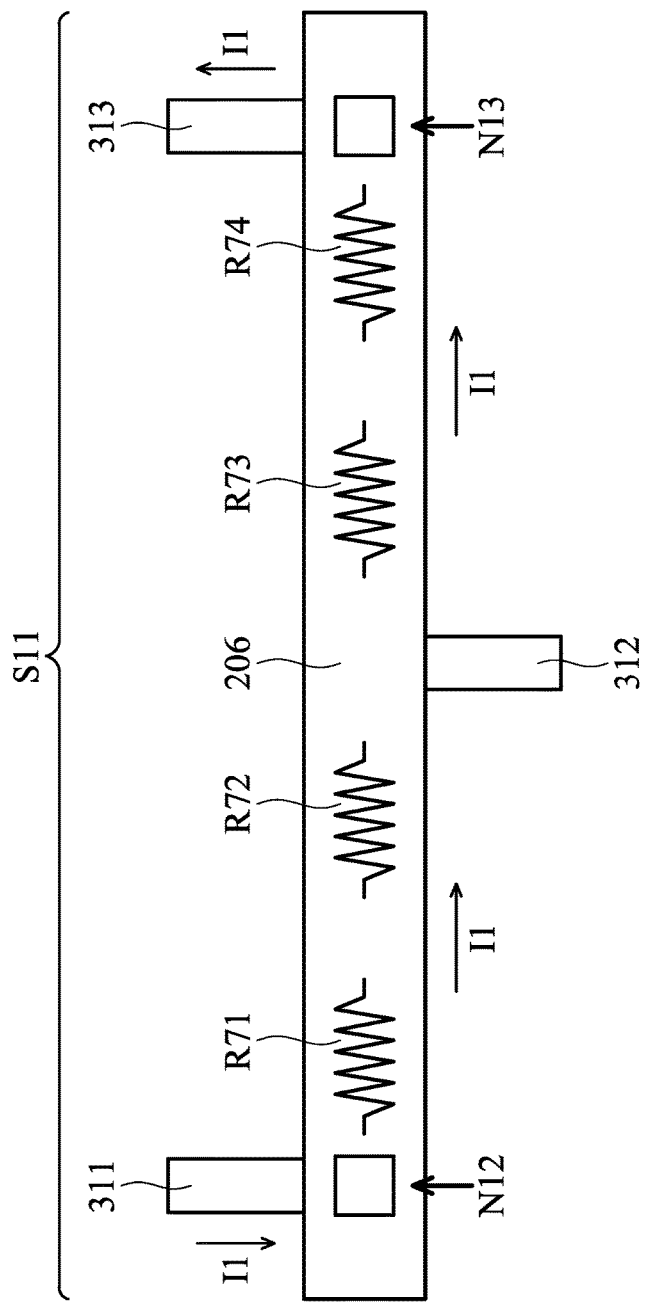
FIG. 7 is a schematic diagram illustrating current direction with nodes and metal segments of a metal line, in accordance with some embodiments.

FIG. 7 is a schematic diagram illustrating current direction with nodes and metal segments of a metal line, in accordance with some embodiments. The current direction is considered for evaluating the FIT value. Three VIAs 311-313 are connected to the metal line 206. The VIA 311 is determined to be node N12, VIA 313 is determined to be node N13. Resistors R71-R74 are arranged between nodes N12 and N13.

In some embodiments, as shown in FIG. 7, whether or not a current passes through the VIA is detected. When the current passes through the VIAs, the VIA is determined to be the node. In other words, when no current passes through the VIA, the VIA will not be regarded as a node.

As shown in FIG. 7, the current IC passes through the VIA 311, the metal line 206 and the VIA 313. Since the current does not pass through the VIA 312, the VIA 312 will not be determined to be a node. Therefore, there are two nodes N12 and N13 along the metal line 206, and the metal segment S11 can be determined based on the nodes N12 and N13 in order to evaluate the FIT value.

Figure 8:
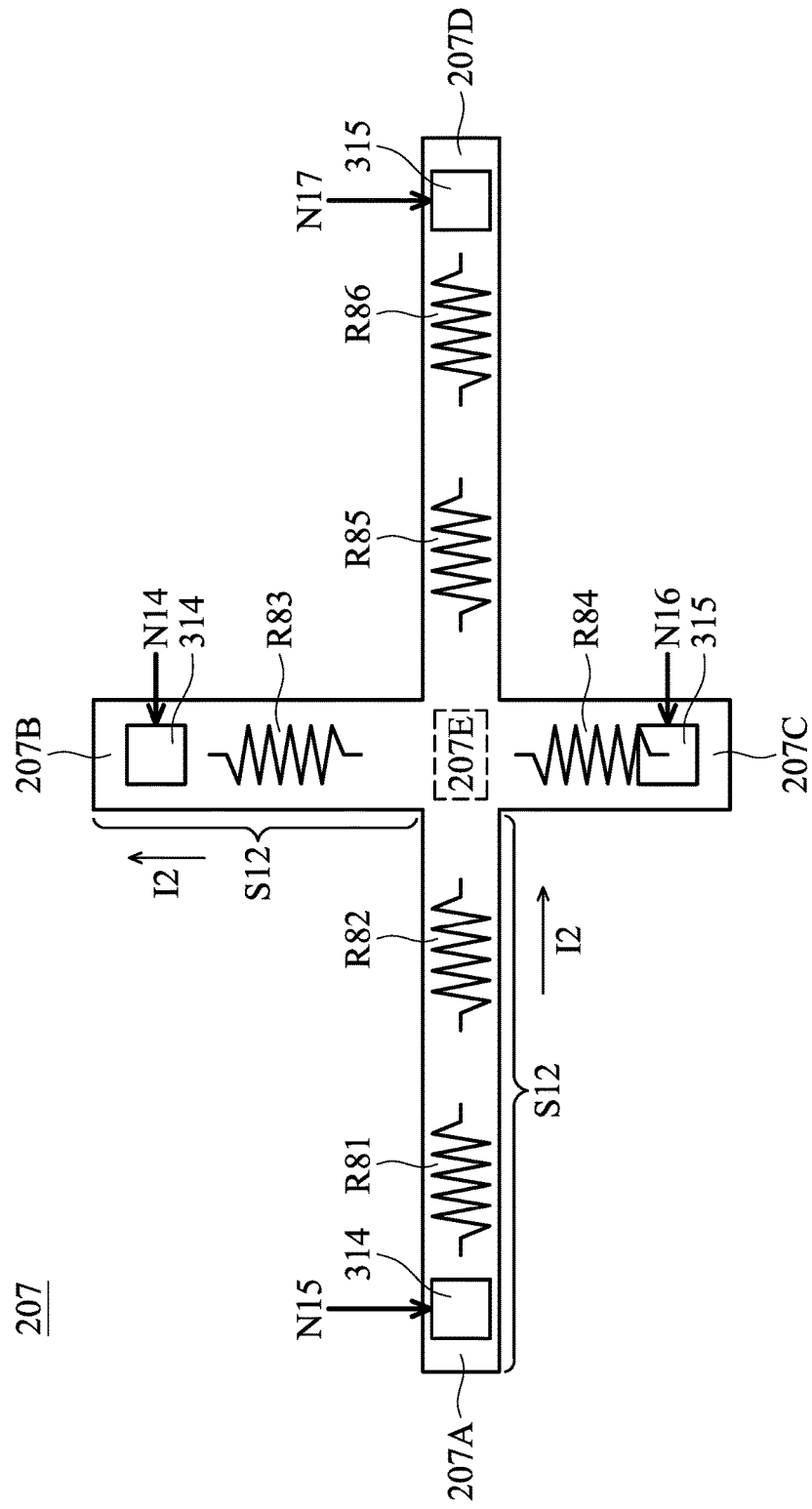
FIG. 8 is a schematic diagram illustrating current direction with branches of metal lines, in accordance with some embodiments.

FIG. 8 is a schematic diagram illustrating current direction with branches of a metal line, in accordance with some embodiments. The current direction is considered for evaluate the FIT value. The metal line 207 is connected with VIAs 314 and 315. The shape of metal line 207 is a cross-junction. Furthermore, the metal line 207 includes four branches 207A-207D and an intersection 207E. Branches 207A and 207D are perpendicular to the branches 207B and 207C, and each of the four branches 207A-207D are connected to the intersection 207E.

In some embodiments, as shown in FIG. 8, whether or not a current passes through more than two branches of the intersection is detected. When the current passes through more than two branches of the intersection, the intersection is determined to be the node. In other words, when the current does not pass through more than two branches of the intersection, the intersection will not be regarded as a node.

As shown in FIG. 8, the current I2 passes through the VIA 314, the branches 207A-207B, and the VIA 314. In other words, the current passes through two branches 207A-207B, it does not pass through more than two branches. Since the current does not pass through the branches 207C and 207D, the intersection 207E will not be determined to be a node.

Therefore, current passes through nodes N14 and N15, and the metal segment S12 can be determined based on the nodes N14 and N15 in order to evaluate the FIT value. It should be noted that, because the current does not pass through the branches 207C and 207D, the branches 207C and 207D will not be regarded as metal segments to estimate FIT values.

Figure 9B:
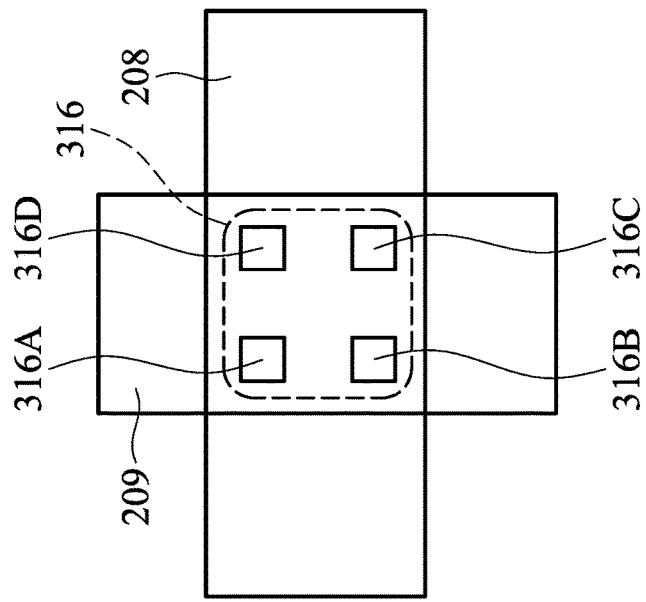
FIGS. 9A-9B are schematic diagrams for illustrating VIAs and metal lines, in accordance with some embodiments.
Figure 9A:
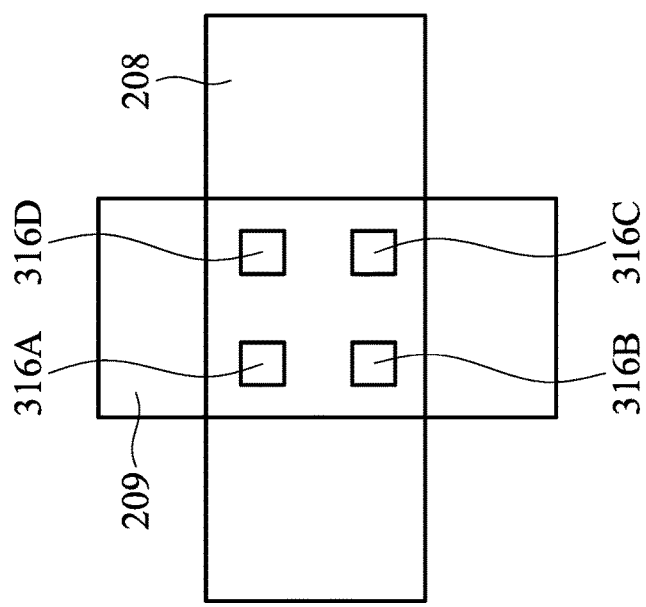

FIGS. 9A-9B are schematic diagrams for illustrating VIAs and metal lines, in accordance with some embodiments. Four VIAs 316A-316D are connected to the metal lines 208 and 209, and the four VIAs 316A-316D make up the VIA array 316. In some embodiments, as shown in FIG. 9A, FIT values for each of the VIAs 316A-316D are calculated. Afterwards, the maximum of the calculated FIT values is determined to be the representative FIT value of the VIA array 316. Since FIT value of each of VIAs 316A-316D is calculated, the representative FIT value of the VIA array 316 will be accurate.

As shown in FIG. 9B, in some embodiments, total current of the VIA array 316 and total electro-migration (EM) limit of the VIA array 316 are calculated to evaluate FIT value of the VIA array 316. Because total current and total EM limit are utilized to estimate FIT value without considering each VIA 316A-316D individually, the FIT value can be evaluated quickly.

Figure 10:
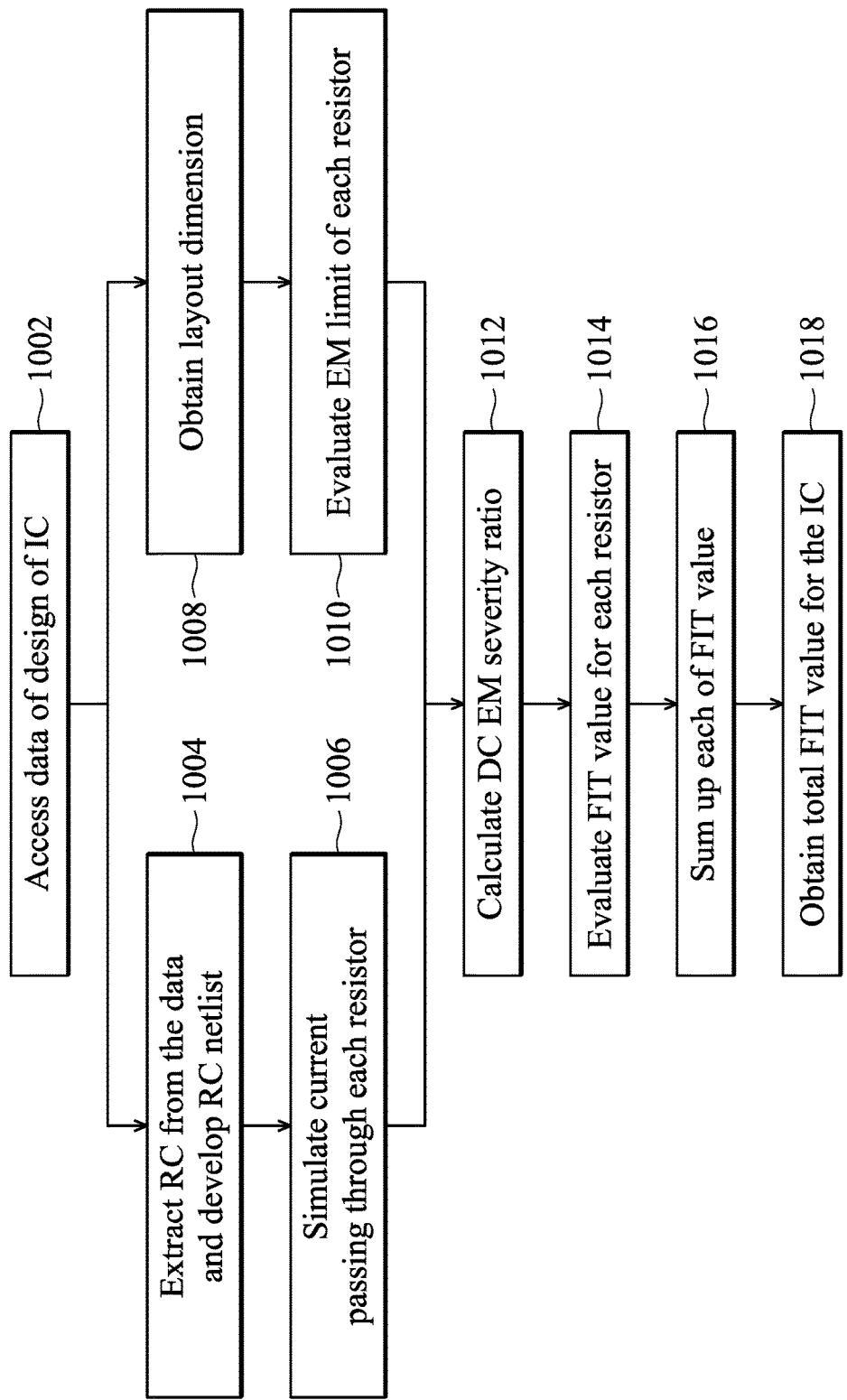
FIG. 10 is a flow chart of a method illustrating the operations for evaluating FIT value, in accordance with some embodiments.

FIG. 10 is a flow chart of a method illustrating the operations for evaluating FIT value, in accordance with some embodiments. In operation 1002, data of design (i.e., layout) of an IC is accessed from, for example, cell information, foundry data, design rules and technology file. Afterwards, operations 1004 and 1008 will be executed in the method.

In operation 1004, resistors and capacitors (RC) are extracted from the accessed data, and RC netlist can be developed accordingly. The RC netlist is a schematic illustrating the arrangement of resistors and capacitors in metal lines of the data of an IC. Afterwards, in operation 1006, currents passing through each resistor are simulated by circuit simulation tools.

Furthermore, in operation 1008, layout dimension is obtained based on the data of design of IC. In operation 1010, the EM limit of each resistor can be estimated. Afterwards, in operation 1012, which is executed after operations 1006 and 1010, the DC EM severity ratio can be calculated according to the equation as shown before.

In operation 1014, the FIT value for each resistor is evaluated. Details of the method for evaluating the FIT value will be illustrated in the flow charts of FIG. 11-12. In operation 1016, each of the FIT values is added. In operation 1018, the total FIT value for the IC can be derived accordingly.

Figure 11:
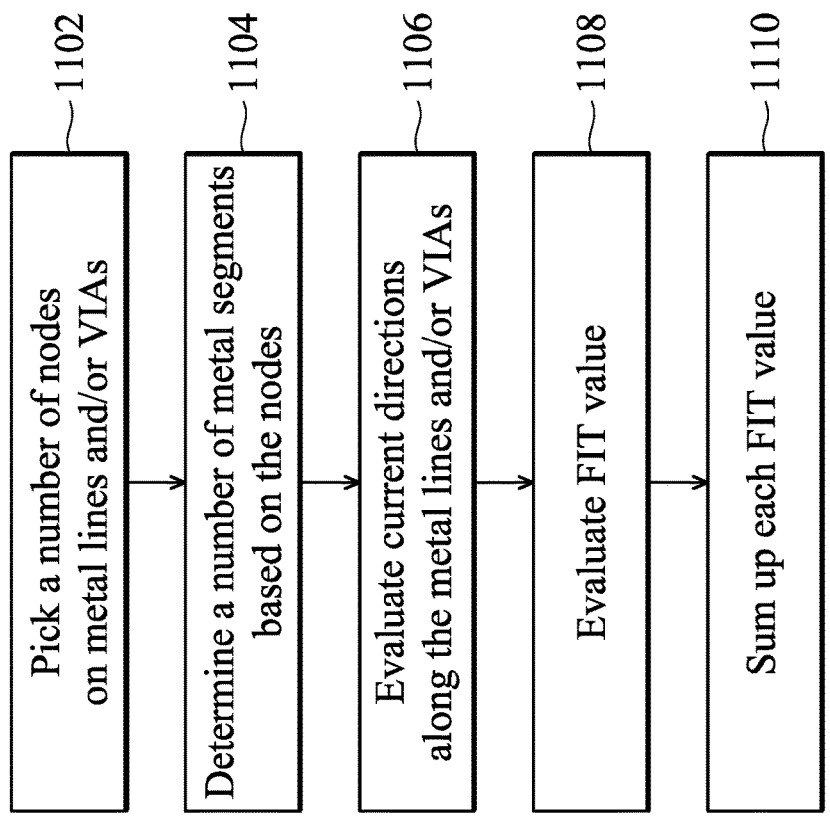
FIG. 11 is a flow chart of a method illustrating the operations for evaluating FIT value, in accordance with some embodiments.

FIG. 11 is a flow chart of a method illustrating the operations for evaluating FIT value, in accordance with some embodiments. In operation 1102, a number of nodes on metal lines and/or VIAs are picked. Specifically, in some embodiments, vias or an intersection of metal lines can be picked to be the nodes by the EDA tool or circuit simulation tools. In operation 1104, a number of metal segments are determined based on the nodes.

Afterwards, in operation 1106, current directions along each of the metal lines and/or VIAs are determined. In operation 1108, the FIT value of each of the metal segments is evaluated. The evaluation of FIT value has been illustrated before, and will not be repeated again.

In operation 1110, a total FIT value for the IC can be derived by summing each FIT value. More specifically, the total FIT value for the IC can be derived by summing each of the FIT values of the metal segments, or summing each of the FIT values or each of the representative FIT values of the metal segments. It should be noted that operation 1106 is optional and can be neglected in performing the method.

Figure 12:
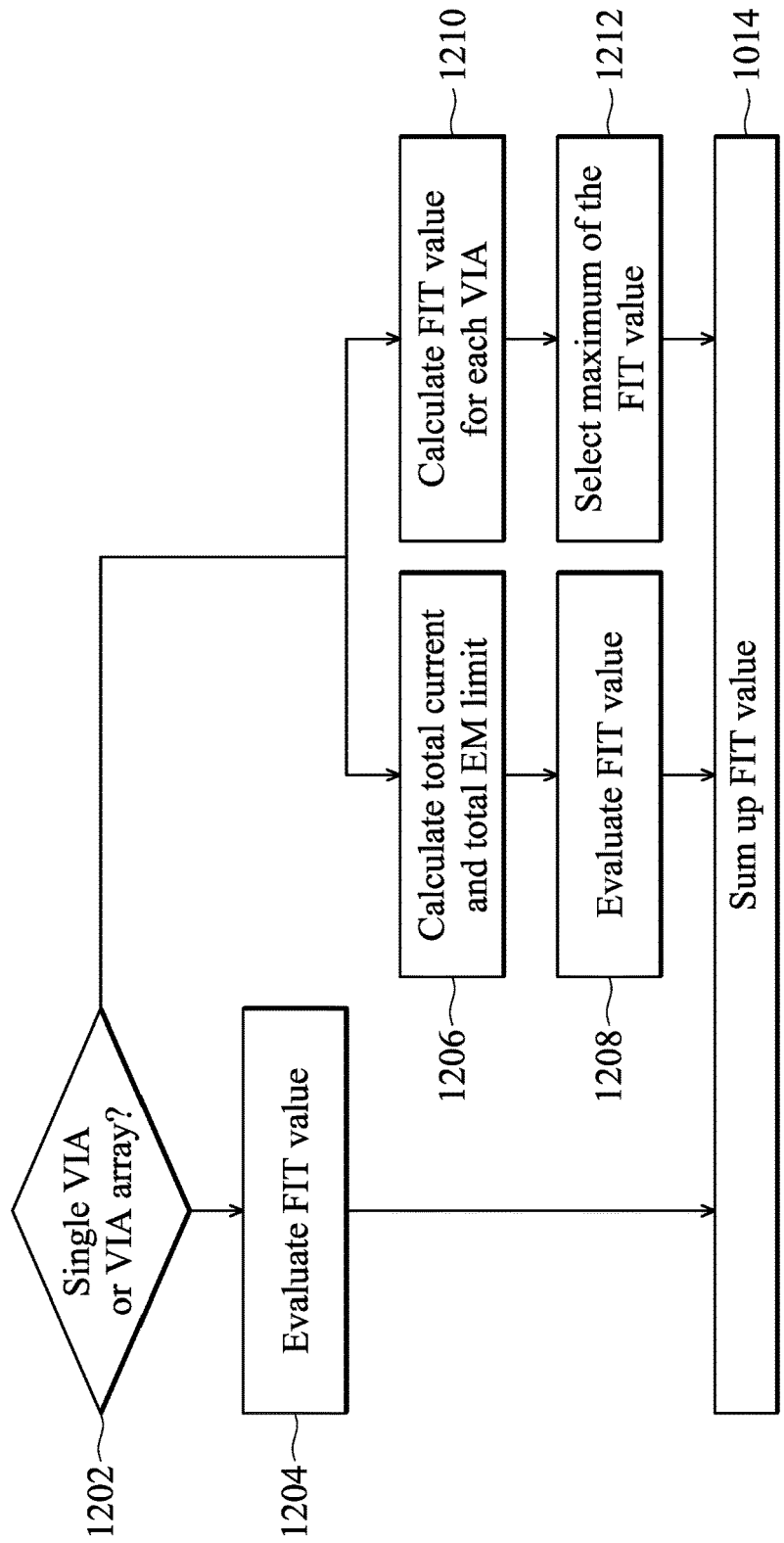
FIG. 12 is a flow chart of a method illustrating the operations for evaluating FIT value, in accordance with some embodiments.

FIG. 12 is a flow chart of a method illustrating the operations for evaluating FIT value, in accordance with some embodiments. In operation 1202, whether a VIA is a single VIA or a VIA array is determined. If it is a single VIA, operation 1204 will be executed. If it is a VIA array, either operation 1206 or 1210 is determined.

In operation 1204, the FIT value of the signal VIA is calculated. Furthermore, in operation 1206, the total current and total EM limit of the VIA array are calculated. In operation 1208, the FIT value of the VIA array is evaluated.

In operation 1210, a FIT value for each VIA is calculated. In operation 1212, the maximum FIT value is selected to be the representative FIT value of the VIA array. In operation 1214, each of the FIT values is added.

Figure 13:
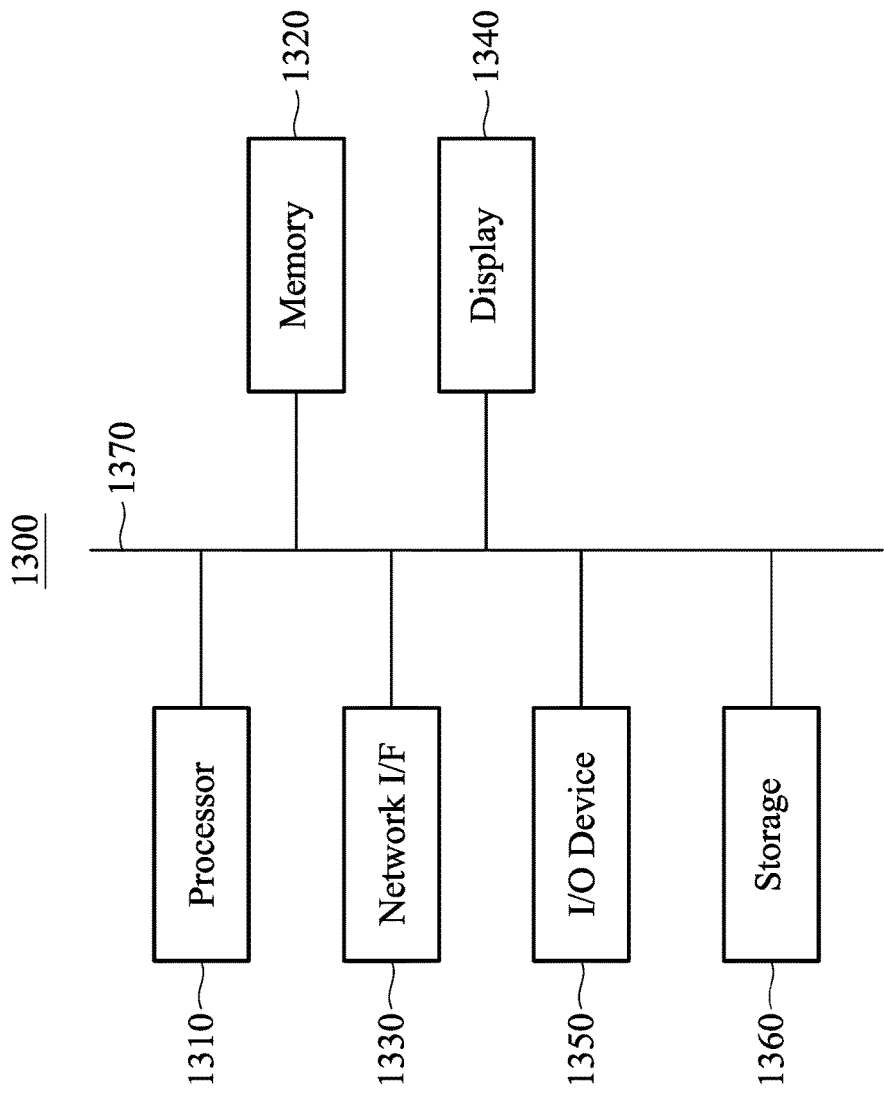
FIG. 13 is a block diagram of a computer system for evaluating FIT value, in accordance with some embodiments.

FIG. 13 is a block diagram of a computer system for evaluating FIT value, in accordance with some embodiments. One or more of the tools and/or systems and/or operations described with respect to FIGS. 1-12 is realized in some embodiments by one or more computer systems 1300 of FIG. 13. The computer system 1300 includes a processor 1310, a memory 1320, a network interface (I/F) 1330, a display 1340, an input/output (I/O) device 1350, and one or more hardware components 1360 communicatively coupled via a bus 1370 or another interconnection communication mechanism.

The memory 1320 comprises, in some embodiments, a random access memory (RAM) and/or other dynamic storage device and/or read only memory (ROM) and/or other static storage devices, coupled to the bus 1370 for storing data and/or instructions to be executed by the processor 1310. The memory 1320 is also used, in some embodiments, for storing temporary variables or other intermediate information during execution of instructions to be executed by the processor 1310.

The display 1340 is utilized to display the RC netlist and the layout of the IC. The display 1340 can be liquid-crystal panels or touch display panels. The I/O device 1350 includes an input device, an output device and/or a combined input/output device for enabling user interaction with the computer system 1300. An input device comprises, for example, a keyboard, keypad, mouse, trackball, trackpad, and/or cursor direction keys for communicating information and commands to the processor 1310. An output device comprises, for example, a display, a printer, a voice synthesizer, etc. for communicating information to the user.

In some embodiments, one or more operations and/or functions of the tools and/or systems described with respect to FIGS. 1-13 are realized by the processor 1310, which is programmed for performing such operations and/or functions. One or more of the memory 1320, the I/F 1330, the display 1340, the I/O device 1350, the hardware components 1360, and the bus 1370 is/are operable to receive instructions, data, design rules, netlists, layouts, models and/or other parameters for processing by the processor 1310.

In some embodiments, one or more of the operations and/or functions of the tools and/or systems described with respect to FIGS. 1-13 is/are implemented by specially configured hardware (e.g., by one or more application-specific integrated circuits or ASIC(s)) which is/are included) separate from or in lieu of the processor 1310. Some embodiments incorporate more than one of the described operations and/or functions in a single ASIC.

In some embodiments, the operations and/or functions are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By assigning nodes and determining metal segments along the metal lines, the FIT values can be evaluated based on the nodes and metal segments. The evaluation of the FIT value is independent with the adopted circuit simulation tools. Therefore, the process for evaluating FIT value is simplified and efficient.

In accordance with some embodiments, a FIT evaluation method for an IC is provided. The FIT evaluation method includes accessing data representing a layout of the IC comprising a number of metal lines and a number of VIAs; picking a number of nodes along the metal lines; dividing each of the metal lines into a number of metal segments based on the nodes; and determining a FIT value for each of the metal segments or the VIAs to verify the layout and fabricate the IC.

In accordance with some embodiments, a FIT evaluation method for an IC is provided. The FIT evaluation method includes determining a number of nodes along a plurality of metal lines and VIAs from data representing a layout of the IC; determining a number of metal segments in the metal lines based on the nodes; and evaluating the FIT value for each of the metal segments; and evaluating the FIT value for each of the VIAs. The FIT values of the metal segments and VIAs are utilized to verify the layout and fabricate the IC.

In accordance with some embodiments, the disclosure provides a non-transitory computer-readable medium containing instructions which, when executed by a processor of a computer system, cause the processor to execute a FIT evaluation method including determining a number of nodes along a number of metal lines and VIA from data representing a layout of an integrated circuit (IC); determining a number of metal segments in the metal lines based on the nodes; evaluating the FIT value for each of the metal segments; and evaluating the FIT value for each of the VIAs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A failure-in-time (FIT) evaluation method for an integrated circuit (IC), comprising:
   accessing data representing a layout of the IC comprising a plurality of metal lines and a plurality of vertical interconnect accesses (VIAs);
   picking a plurality of nodes along the metal lines;
   dividing each of the metal lines into a plurality of metal segments based on the nodes; and
   determining FIT value for each of the metal segments and the VIAs to verify the layout and fabricate the IC.

2. The FIT evaluation method as claimed in claim 1, wherein picking the plurality of nodes along the metal lines further comprises assigning the VIAs to be the nodes.

3. The FIT evaluation method as claimed in claim 2, wherein assigning the VIAs to be the nodes further comprises detecting whether or not a current passes through one of the VIAs, and assigning the one of the VIAs to be one of the nodes when the current passes through the one of the VIAs.

4. The FIT evaluation method as claimed in claim 1, wherein picking a plurality of nodes along the metal lines further comprises assigning an intersection of the metal lines to be one of the nodes.

5. The FIT evaluation method as claimed in claim 4, wherein assigning intersections of the metal lines to be the nodes further comprises detecting whether or not a current passes through more than two branches of the intersection, and assigning the intersection to be the one of the nodes when the current passes through more than two branches.

6. The FIT evaluation method as claimed in claim 1, wherein each of the metal segments is arranged between two different nodes, or each of the metal segments is arranged between one of the nodes and a metal line end.

7. The FIT evaluation method as claimed in claim 1, wherein when one of the metal segments comprises more than two FIT values, determining maximum of the FIT values to be a representative FIT value of the one of the metal segments.

8. The FIT evaluation method as claimed in claim 7, further comprising determining a total FIT value of the IC by summing each of the FIT values of the metal segments, or summing each of the FIT values or each of the representative FIT values of the metal segments.

9. The FIT evaluation method as claimed in claim 1, wherein the VIAs form a VIA array, and picking the nodes along the metal lines further comprises assigning the VIA array to be one of the nodes.

10. The FIT evaluation method as claimed in claim 9, wherein determining a FIT value for each of the VIAs comprises calculating total current and total electro-migration (EM) limits to evaluate FIT value of the VIA array.

11. The FIT evaluation method as claimed in claim 9, wherein determining the FIT value for each of the VIAs comprises determining a maximum for the calculated FIT values to be a representative FIT value of the VIA array.

12. A failure-in-time (FIT) evaluation method for an integrated circuit (IC), comprising:
    determining a plurality of nodes along a plurality of metal lines and a plurality of vertical interconnect accesses (VIAs) from data representing a layout of the IC;
    determining a plurality of metal segments in the metal lines based on the nodes; and
    evaluating FIT value for each of the metal segments; and evaluating FIT value for each of the VIAs, wherein FIT values for the metal segments and VIAs are utilized to verify the layout and fabricate the IC.

13. The FIT evaluation method as claimed in claim 12, wherein determining the nodes on the plurality of metal lines and VIAs comprises:
    assigning the VIAs to be the nodes or assigning intersections of the metal lines to be the nodes.

14. The FIT evaluation method as claimed in claim 12, wherein each one of the metal segment is arranged between two different nodes, or arranged between one of the nodes and a metal line end.

15. The FIT evaluation method as claimed in claim 14, wherein when one of the metal segments has more than two FIT values, maximum of the FIT values is assigned to be a representative FIT value of the one of the metal segments.

16. The FIT evaluation method as claimed in claim 15, further comprising determining a total FIT value of the IC by summing each of the FIT values of the metal segments, or summing each of the FIT values or each of the representative FIT values of the metal segments.

17. A non-transitory computer-readable medium containing instructions which, when executed by a processor of a computer system, cause the processor to execute a FIT evaluation method comprising:
- determining a plurality of nodes along a plurality of metal lines and a plurality of vertical interconnect accesses (VIAs) from data representing a layout of an integrated circuit (IC);
- determining a plurality of metal segments in the metal lines based on the nodes; and
- evaluating FIT value for each of the metal segments; and
- evaluating FIT value for each of the VIAs, wherein FIT values of the metal segments and VIAs are utilized to verify the layout and fabricate the IC.

18. The non-transitory computer-readable medium as claimed in claim 17, wherein determining the nodes on the plurality of metal lines and the plurality of VIAs comprises:
- assigning the VIAs to be the nodes or assigning intersections of the metal lines to be the nodes, wherein one of the metal segments is arranged between two different nodes, or arranged between one of the nodes and a metal line end.

19. The non-transitory computer-readable medium as claimed in claim 18, wherein when one of the metal segments has more than two FIT values, maximum of the FIT values is assigned to be a representative FIT value of the one of the metal segments.

20. The non-transitory computer-readable medium as claimed in claim 18, wherein the method further comprises determining a total FIT value of the IC by summing each of the FIT values of the metal segments, or summing each of the FIT values or each of the representative FIT values of the metal segments.

* * * * *